United States Patent
Chu et al.

(10) Patent No.: US 10,328,664 B2
(45) Date of Patent: Jun. 25, 2019

(54) DISPLAY DEVICE AND ELECTRONIC DEVICE

(71) Applicant: InnoLux Corporation, Miao-Li County (TW)

(72) Inventors: Hsia-Ching Chu, Miao-Li County (TW); Ming-Chien Sun, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/838,422

(22) Filed: Dec. 12, 2017

(65) Prior Publication Data

US 2018/0178483 A1 Jun. 28, 2018

(30) Foreign Application Priority Data

Dec. 23, 2016 (CN) .......................... 2016 1 1205541

(51) Int. Cl.
| | |
|---|---|
| *H01L 27/12* | (2006.01) |
| *B32B 3/28* | (2006.01) |
| *B32B 7/12* | (2006.01) |
| *B32B 27/36* | (2006.01) |
| *B32B 27/28* | (2006.01) |
| *B32B 27/08* | (2006.01) |

(52) U.S. Cl.
CPC .................. *B32B 3/28* (2013.01); *B32B 7/12* (2013.01); *B32B 27/08* (2013.01); *B32B 27/281* (2013.01); *B32B 27/36* (2013.01); *H01L 27/1218* (2013.01); *B32B 2457/20* (2013.01)

(58) Field of Classification Search
CPC ................. H01L 27/1218; H01L 27/32; H01L 23/49572; H01L 23/5388; H01L 23/4985; H01L 23/5387; B32B 3/28; B32B 7/12; B32B 27/08; B32B 27/281; B32B 27/36; G02F 1/133308; G02F 1/13
See application file for complete search history.

(56) References Cited

U.S. PATENT DOCUMENTS

| | | | |
|---|---|---|---|
| 9,274,559 B2 * | 3/2016 | Prushinskiy | G06F 1/1652 |
| 9,276,055 B1 * | 3/2016 | Son | H01L 27/3276 |
| 9,485,858 B2 * | 11/2016 | Namkung | H05K 1/028 |
| 9,793,334 B2 * | 10/2017 | Park | H01L 51/5253 |

(Continued)

FOREIGN PATENT DOCUMENTS

KR 20090128350 A * 12/2009 ............... B32B 7/12

*Primary Examiner* — Earl N Taylor
(74) *Attorney, Agent, or Firm* — Bacon & Thomas, PLLC

(57) ABSTRACT

A display device is disclosed, which includes: a support layer including a first surface, a second surface and a first side wall, wherein the first surface and the second surface locate at two opposite sides of the support layer, the first side wall connects the first surface and the second surface, a first angle is included between the first surface and the first side wall, and a second angle is included between the second surface and the first side wall; an adhesion layer disposed on the support layer; a base layer disposed on the adhesion layer; and plural transistors disposed on the base layer, wherein the first angle and the second angle are greater than 0 degree and less than 180 degrees, and the first angle and the second angle are different. In addition, an electronic device including the aforesaid display device is also disclosed.

19 Claims, 7 Drawing Sheets

(56) References Cited

U.S. PATENT DOCUMENTS

| | | | |
|---|---|---|---|
| 9,859,308 B1* | 1/2018 | Ellinger | H01L 27/1251 |
| 2001/0010569 A1* | 8/2001 | Jin | G02F 1/133308 |
| | | | 349/58 |
| 2011/0299151 A1* | 12/2011 | Wu | G02B 26/005 |
| | | | 359/296 |
| 2012/0320329 A1* | 12/2012 | Lee | G02F 1/133305 |
| | | | 349/158 |
| 2014/0183473 A1* | 7/2014 | Lee | H01L 51/0097 |
| | | | 257/40 |
| 2015/0014672 A1* | 1/2015 | Yamae | H05B 33/04 |
| | | | 257/40 |
| 2015/0146386 A1* | 5/2015 | Namkung | H05K 1/028 |
| | | | 361/749 |
| 2015/0227172 A1* | 8/2015 | Namkung | G06F 1/1652 |
| | | | 345/173 |
| 2015/0313004 A1* | 10/2015 | Namkung | G06F 1/1652 |
| | | | 361/749 |
| 2016/0021732 A1* | 1/2016 | Zhou | G02F 1/1333 |
| | | | 361/749 |
| 2016/0172623 A1* | 6/2016 | Lee | H01L 51/5253 |
| | | | 257/40 |
| 2016/0370644 A1* | 12/2016 | Wang | G02F 1/133526 |
| 2017/0045914 A1* | 2/2017 | Namkung | G02F 1/133305 |
| 2017/0194411 A1* | 7/2017 | Park | H01L 51/5253 |
| 2017/0236877 A1* | 8/2017 | Jeong | H01L 27/124 |
| | | | 257/40 |
| 2017/0294621 A1* | 10/2017 | Higano | H01L 51/5253 |
| 2018/0067522 A1* | 3/2018 | Namkung | G02F 1/133305 |
| 2018/0081399 A1* | 3/2018 | Kwon | G06F 1/1652 |
| 2018/0120495 A1* | 5/2018 | Liang | G02B 6/0056 |
| 2018/0123060 A1* | 5/2018 | Jang | H01L 27/12 |
| 2018/0147810 A1* | 5/2018 | Cheon | H04M 1/0202 |
| 2018/0159087 A1* | 6/2018 | Yug | G02F 1/133351 |
| 2018/0166652 A1* | 6/2018 | Kim | B32B 7/12 |
| 2018/0178483 A1* | 6/2018 | Chu | B32B 27/36 |
| 2018/0183002 A1* | 6/2018 | Kawata | H01L 51/5246 |
| 2018/0226611 A1* | 8/2018 | Andou | H01L 51/5253 |

* cited by examiner

DISPLAY DEVICE AND ELECTRONIC DEVICE

CROSS REFERENCE TO RELATED APPLICATION

This application claims the benefits of the Chinese Patent Application Serial Number 201611205541.3, filed on Dec. 23, 2016, the subject matter of which is incorporated herein by reference.

BACKGROUND

1. Field

The present disclosure relates to a display device and an electronic device, more particularly, to a display device comprises a support layer with specific side wall and an electronic device using the same.

2. Description of Related Art

With the continuous advancement of technologies related to displays, all the display devices are now developed toward compactness, thinness, and lightness. Applications of thin displays are numerous. Most electronic devices for daily use, such as mobile phones, notebook computers, video cameras, still cameras, music displays, mobile navigators, and TV sets, employ such display panels.

Although the thickness and the weight of the display devices are greatly reduced in the thin displays, the demands for the thinner thickness and lighter weight of the electronic devices still exist as the display devices developed. Hence, the glass substrates with thicker thickness used in the display devices are substituted with other substrates with thinner thickness.

However, when the substrate with thinner thickness is used as a support layer to prepare the display device, the stiffness of the substrate with thinner thickness is not enough if the display units are directed formed thereon.

SUMMARY

An object of the present disclosure is to provide a display device and an electronic device, wherein a display device comprises a support layer with specific side wall and an electronic device using the same.

In one aspect of the present disclosure, the display device comprises: a support layer comprising a first surface, a second surface and a first side wall, wherein the first surface and the second surface locate at two opposite sides of the support layer, the first side wall connects the first surface and the second surface, a first angle is included between the first surface and the first side wall, and a second angle is included between the second surface and the first side wall; an adhesion layer disposed on the support layer; a base layer disposed on the adhesion layer; and plural transistors disposed on the base layer, wherein the first angle and the second angle are greater than 0 degree and less than 180 degrees, and the first angle and the second angle are different.

In another aspect of the present disclosure, the electronic device comprises a display device comprising: a support layer with a first surface, a second surface and a first side wall, wherein the first surface and the second surface locate at two opposite sides of the support layer, the first side wall connects the first surface and the second surface, a first angle is included between the first surface and the first side wall, and a second angle is included between the second surface and the first side wall; an adhesion layer disposed on the support layer; a base layer disposed on the adhesion layer, wherein the base layer comprises a central portion and a first bending portion, the first bending portion is adjacent to the central portion, and the first bending portion is bended toward the support layer; and plural transistors disposed on the base layer, wherein the first angle and the second angle are greater than 0 degree and less than 180 degrees, and the first angle and the second angle are different.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other substrate or film, but also intended indirectly contact with the other substrate or film.

Figure 1:
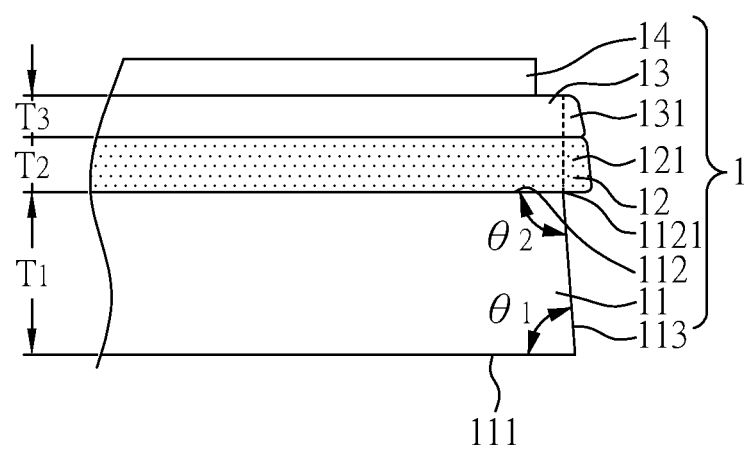
FIG. 1 is a cross sectional view of a display device according to one embodiment of the present disclosure.

FIG. 1 is a cross sectional view of a display device according to one embodiment of the present disclosure. The process for preparing the display device of the present embodiment is briefly described below. First, a support layer 11 is provided, which can be prepared by a substrate material such as glass, plastic, flexible materials or films. In the present embodiment, the support layer 11 can be flexible. The material of the support layer 11 can be polyethylene terephthalate (PET) or polyethylene naphthalate (PEN), but the present disclosure is not limited thereto. Next, an adhesion layer 12 is formed on the support layer 11, and the adhesion layer 12 can be prepared with glue. Then, a base layer 13 is formed on the adhesion layer 12, and the base layer 13 can be prepared by a substrate material such as glass, plastic, flexible materials or films. In the present embodiment, the material of the base layer 13 can be polyimide (PI), but the present disclosure is not limited thereto. Finally, plural transistors 14 are formed on the base layer 13. Herein, even though the figure does not show, in the display device of the present embodiment, a display layer, another adhesion layer, a barrier layer and a polarizer can be sequentially formed after forming the transistors 14. In addition, other functional layers may be formed between layers if it is necessary.

After the aforesaid process, the display device of the present embodiment can be obtained. Herein, according to the types of the display layer, the display device of the present embodiment can be various kinds of display devices. For example, if the display layer is a liquid crystal layer, the display device can be a liquid crystal display device (LCD). If the display layer is an organic light emitting diode layer, the display device can be an organic light emitting diode display device (OLED). If the display layer is an inorganic light emitting diode layer with mini-meter size, the display device can be a micro light emitting diode (mini-LED) display device. If the display layer is an inorganic light emitting diode layer with micro-meter size, the display device can be a micro light emitting diode (micro-LED) display device.

As shown in FIG. 1, the display device of the present embodiment comprises: a substrate 1, comprising: a support layer 11 comprising a first surface 111, a second surface 112 and a first side wall 113, wherein the first surface 111 and the second surface 112 locate at two opposite sides of the support layer 11, the first side wall 113 connects the first surface 111 and the second surface 112, a first angle $\theta 1$ is included between the first surface 111 and the first side wall 113, and a second angle $\theta 2$ is included between the second surface 112 and the first side wall 113; an adhesion layer 12 disposed on the support layer 11; a base layer 13 disposed on the adhesion layer 12; and plural transistors 14 disposed on the base layer 13. Herein, the first angle $\theta 1$ and the second angle $\theta 2$ are respectively greater than 0 degree and less than 180 degrees, and the first angle $\theta 1$ and the second angle $\theta 2$ are different.

Figure 2A:
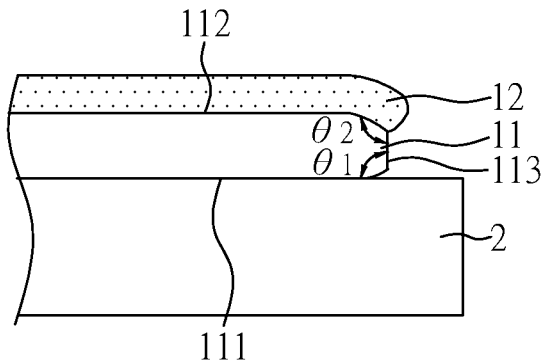
FIG. 2A to FIG. 2C are cross sectional views of support layers with different aspects in display devices of the present disclosure.
Figure 2B:
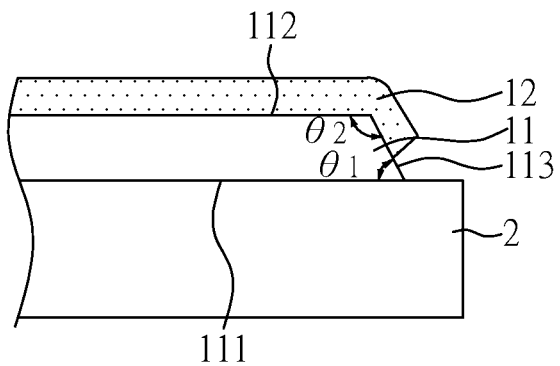
Figure 2C:
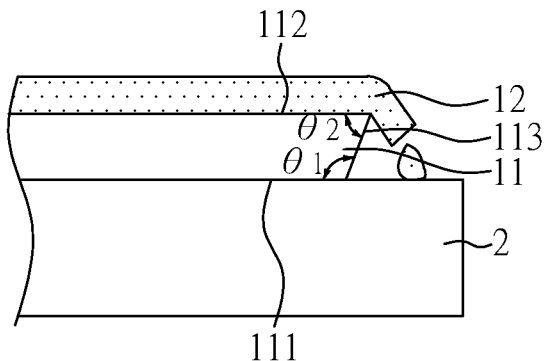

In the present embodiment, the base layer 13 can be flexible, which can be prepared by a substrate material such as plastic, flexible materials or films. Hence, the display device of the present embodiment is a flexible display device. Similarly, as illustrated above, the display device of the present embodiment can be various kinds of display devices according to the types of the display layer, for example, a flexible liquid crystal display device, a flexible organic light emitting diode display device, or a flexible inorganic light emitting diode display device; but the present disclosure is not limited thereto. When preparing the flexible display device, a carrier 2 (as shown in FIG. 2A to FIG. 2C) is disposed on the bottom of the support layer 11 in advance; and the carrier 2 is removed after the process for preparing the display device is completed. When the first angle $\theta 1$ included between the first surface 111 and the first side wall 113 of the support layer 11 is not equal to the second angle $\theta 2$ included between the second surface 112 and the first side wall 113, the problem that the glue for forming the adhesion layer 12 overflows onto the bottom of the support layer 11 which may cause the carrier 2 uneasily separated from the support layer 11 during the process for preparing the display device can be solved.

For example, when the first angle $\theta 1$ included between the first surface 111 and the first side wall 113 of the support layer 11 is equal to the second angle $\theta 2$ included between the second surface 112 and the first side wall 113 and both the first angle $\theta 1$ and the second angle $\theta 2$ are 90 degrees, the glue for forming the adhesion layer 12 may flow to the bottom of the support layer 11 along the first side wall 113 and be adhered onto the carrier 2. In a severe situation, the glue for forming the adhesion layer 12 may overflow to the interface between the support layer 11 and the carrier 2. In this situation, after the process for forming the flexible display device is completed, the carrier 2 cannot be easily separated from the support layer 11 because the adhesion layer 12 covers the whole first side wall 113 of the support layer 11 and is further adhered on the carrier 2.

In the present disclosure, when the first angle $\theta 1$ is not equal to the second angle $\theta 2$, the aforementioned problem can be prevented. Herein, FIG. 2A to FIG. 2C are cross sectional views of support layers 11 with different aspects in display devices according to various embodiments of the present disclosure. For simple expressions, other layers on the adhesive layer 12 are not shown in the figures.

As shown in FIG. 2A, the first side wall 113 of the support layer 11 is a non-uniform side wall, wherein the first angle $\theta 1$ is not equal to the second angle $\theta 2$ and both the first angle $\theta 1$ and the second angle $\theta 2$ are obtuse angles. When the glue for forming the adhesive layer 12 overflows, the overflowing glue for forming the adhesive layer 12 does not easily flow to the bottom of the support layer 12 along the first side wall 113 and is not easily adhered on the carrier 2 because the first side wall 113 is a non-uniform side wall. Hence, after the process for preparing the flexible display device is completed, the carrier 2 can be easily separated from the support layer 11.

As shown in FIG. 2B, the first angle $\theta 1$ is not equal to the second angle $\theta 2$, the first angle $\theta 1$ is an acute angle, and the second angle $\theta 2$ is an obtuse angle. Because the first side wall 113 is an inclined side wall, the overflowing path formed by the first side wall 113 for the glue for forming the adhesive layer 12 can be elongated. Thus, when the glue for forming the adhesive layer 12 overflows, the overflowing glue for forming the adhesive layer 12 does not easily approach to the bottom of the support layer 11 and is not easily adhered on the carrier 2. Hence, after the process for preparing the flexible display device is completed, the carrier 2 can be easily separated from the support layer 11.

In addition, as shown in FIG. 2C, the first angle $\theta 1$ is not equal to the second angle $\theta 2$, the first angle $\theta 1$ is an obtuse angle, and the second angle $\theta 2$ is an acute angle. Because the first side wall 113 is an inclined side wall and this inclined side wall has similar structure to the side wall of the trapezoid, when the glue for forming the adhesive layer 12 overflows, the overflowing glue does not easily flow along the first side wall 113 and may be hanged above the carrier 2. In some situations, as shown in FIG. 2C, the overflowing glue may drop onto the carrier 2. In both cases that the overflowing glue for forming the adhesive layer 12 is hanged above the carrier 2 or drops onto the carrier 2, the overflowing glue does not easily approach the bottom of the support layer 11 and is not easily adhered on the carrier 2. Hence, after the process for preparing the flexible display device is completed, the carrier 2 can be easily separated from the support layer 11.

Thus, as shown in FIG. 2A to FIG. 2C, in the display device of the present embodiment, when the support layer 11 has the aforesaid special included angle designs, i.e. the first angle θ1 included between the first surface 111 and the first side wall 113 of the support layer 11 is not equal to the second angle θ2 included between the second surface 112 and the first side wall 113, the problem that the overflowing glue for forming the adhesive layer 12 causes the carrier 2 uneasily separated from the support layer 11 can be prevented. Herein, FIG. 2A to FIG. 2C are only used for illustrating different possible aspects, but the present disclosure is not limited thereto. The support layer 11 may have other shapes different from those shown in FIG. 2A to FIG. 2C, as long as the requirement that the first angle θ1 is different from the second angle θ2 is satisfied.

In addition, as shown in FIG. 1, in the display device of the present embodiment, the support layer 11 has a first thickness T1, the adhesion layer 12 has a second thickness T2, and the base layer 13 has a third thickness T3. The second thickness T2 is less than the first thickness T1, and the third thickness T3 is less than the first thickness T1. Among the support layer 11, the adhesion layer 12 and the base layer 13, the support layer 11 has the largest thickness. It is because the adhesion layer 12, the base layer 13 and other layers are disposed on the support layer 11, thus the support layer 11 has to have the largest thickness to provide sufficient loading strength.

Furthermore, in the display device of the present embodiment, the third thickness T3 of the base layer 13 is less than the second thickness T2 of the adhesion layer 12. It is because the base layer 13 may have to be bended and the base layer 13 is a flexible base layer. Thus, the base layer 13 has to have thinner thickness to provide suitable extensibility. However, the main function of the adhesion layer 12 is to bond the base layer 13 and the support layer 11, so the adhesion layer 12 has to have sufficient thickness to provide enough adhesion.

Figure 3A:
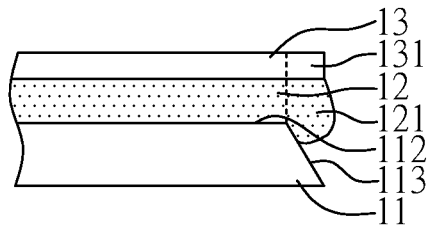
FIG. 3A and FIG. 3B are cross sectional views of adhesion layers and base layers with different aspects in display devices of the present disclosure.
Figure 3B:
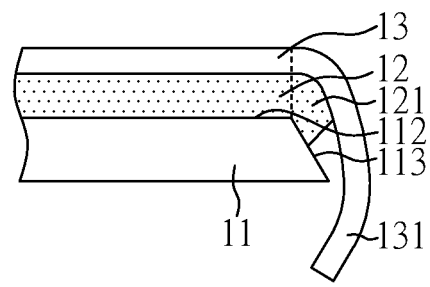

As shown in FIG. 1, in the display device of the present embodiment, the adhesion layer 12 has a first protrusion part 121, and the first protrusion part 121 is protruded outside a top surface (i.e. the second surface 112) of the support layer 11. More specifically, the first protrusion part 121 is protruded outside an intersecting line of the second surface 112 and the first side wall 113 of the support layer 11. Herein, at least a portion of the first protrusion part 121 of the adhesion layer 12 is not in contact with the support layer 11, and does not overlap the support layer 11 (especially, not overlaps the second surface 112 of the support layer 11). In addition, the base layer 13 has a second protrusion part 131, and the second protrusion part 131 is protruded outside the top surface (i.e. the second surface 112) of the support layer 11. More specifically, the second protrusion part 131 is protruded outside an intersecting line of the second surface 112 and the first side wall 113 of the support layer 11. Herein, at least a portion of the second protrusion part 131 is not in contact with the support layer 11 and does not overlap the support layer 11 (especially, not overlap the second surface 112 of the support layer 11). The first side wall 113 and the second surface 112 crosses to form an intersecting line denoted by first edge 1121, the first protrusion part 121 is the portion of the adhesion layer 12 protruded outside the first edge 1121, and the second protrusion part 131 is the portion of the base layer 13 protruded outside the first edge 1121. On the basis of the virtual interface (as indicated by the dashed line) passing through the first edge 1121 and vertical to the second surface 112, the portion of the adhesion layer 12 not overlapping the support layer 11 and protruded outside the virtual interface is the first protrusion part 121, and the portion of the base layer 13 not overlapping the support layer 11 and protruded outside the virtual interface is the second protrusion part 131. In addition, the first protrusion part 121 of the adhesion layer 12 may selectively cover partial first side wall 113 of the support layer 11, as shown in FIG. 3A and FIG. 3B. When the base layer 13 is bendable or an area of the bottom surface of the base layer 13 is greater than an area of the second surface 112 of the support layer 11, the first protrusion part 121 of the adhesion layer 12 may increase the adhesion between the support layer 11 and the base layer 13.

FIG. 3A and FIG. 3B are cross sectional views of adhesion layers and base layers with different aspects in display devices of the present disclosure. Herein, for simple expressions, other layers on the base layer 13 are not shown. As shown in FIG. 3A, an area of the bottom surface of the base layer 13 is greater than an area of the second surface 112 (top surface) of the support layer 11. In FIG. 3B, an area of the bottom surface of the base layer 13 is greater than an area of the second surface 112 of the support layer 11 and also a bendable base layer. Hence, in FIG. 3A and FIG. 3B, at least a portion of the second protrusion part 131 of the base layer 13 does not overlap the second surface 112 of the support layer 11. Wherein an area of the adhesion layer 12 is greater than an area of the support layer 11, at least a portion of the first protrusion part 121 is not in contact with the second surface 112 of the support layer 11, and the first protrusion part 121 can provide adhesion between the second protrusion part 131 of the base layer 13 and the support layer 11. In particular, the first protrusion part 121 of the adhesion layer 12 may further cover partial first side wall 113 of the support layer 11, to further increase the adhesion between the second protrusion part 131 of the base layer 13 and the support layer 11. Herein, FIG. 3A and FIG. 3B are only used for illustrating different possible aspects, but the present disclosure is not limited thereto. The support layer 11, the adhesion layer 12 and the base layer 13 may have other shapes different from those shown in FIG. 3A and FIG. 3B.

Figure 4:
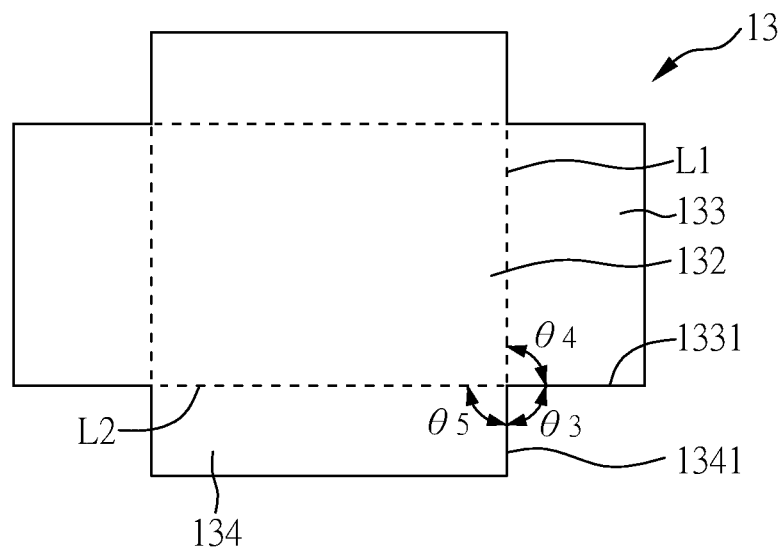
FIG. 4 is a perspective view showing a bending aspect of a base layer in a display device according to one embodiment of the present disclosure.
Figure 4:
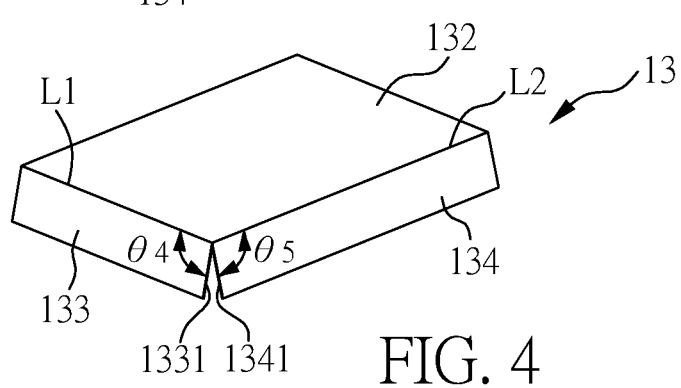
Figure 5:
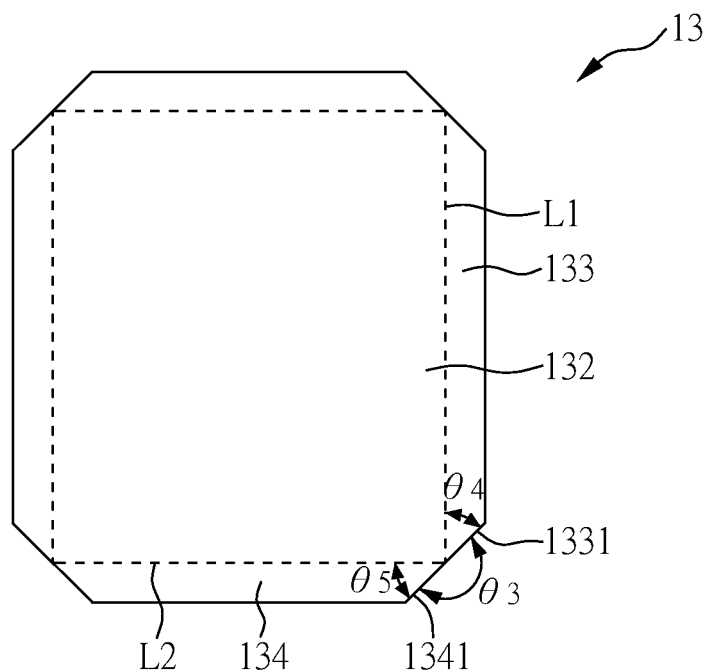
FIG. 5 is a perspective view showing a bending aspect of a base layer in a display device according to another embodiment of the present disclosure.
Figure 5:
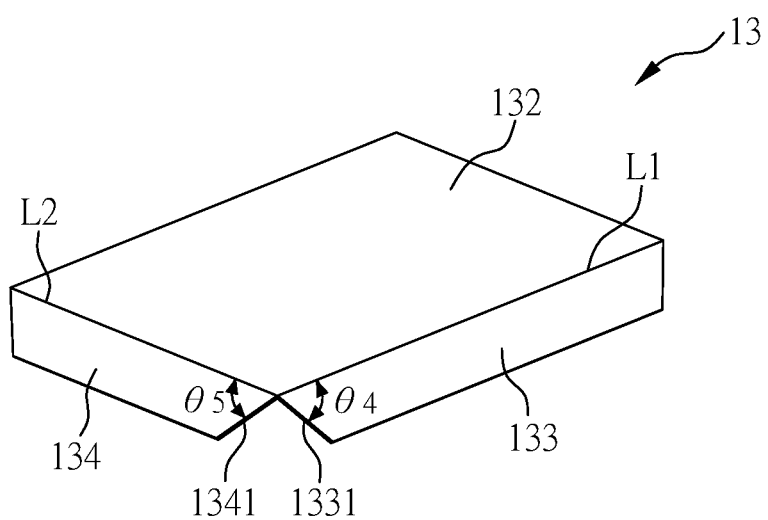
Figure 6:
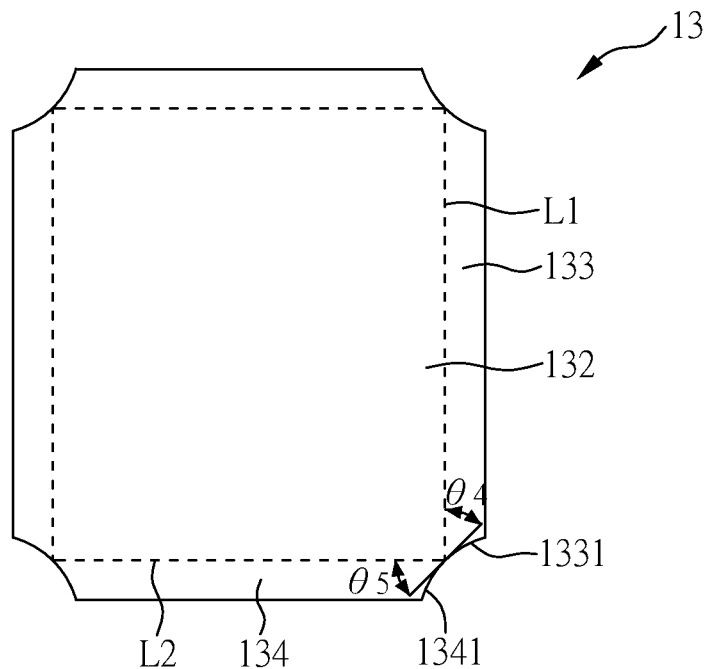
FIG. 6 is a perspective view showing a bending aspect of a base layer in a display device according to further another embodiment of the present disclosure.
Figure 6:
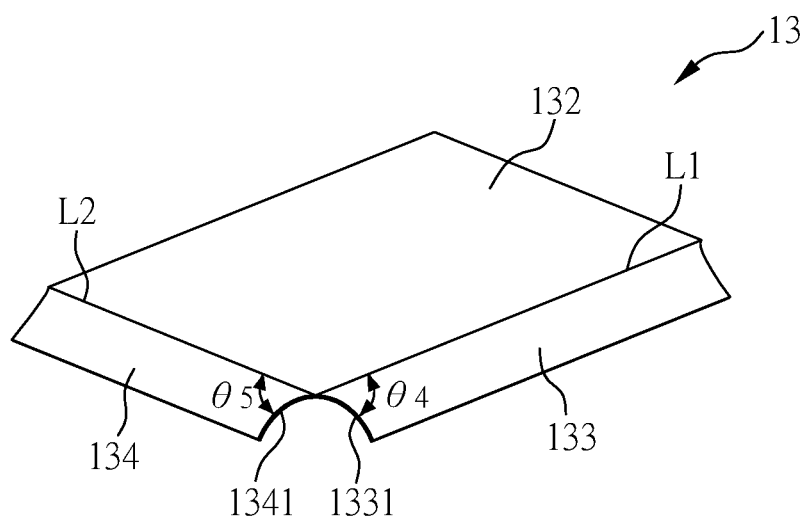

In the present embodiment, the base layer can be flexible, which can be prepared by a substrate material such as plastic, flexible materials or films. Hence, the display device of the present embodiment is a flexible display device. FIG. 4 to FIG. 6 show different bending aspects of a base layer in a flexible display device according to various embodiments of the present disclosure.

In FIG. 4 to FIG. 6, the base layer 13 comprises a central portion 132 and a first bending portion 133. The first bending portion 133 is adjacent to the central portion 132, and an interface between the first bending portion 133 and the central portion 132 is defined as a first bending line L1. The first bending portion 133 could have the same meaning of the first protrusion part 121 or the second protrusion part 131 in the previous paragraphs. The first bending line L1 could be an intersecting line between the base layer 13 and the first protrusion part 121 or the second protrusion part 131 in the previous paragraphs. In addition, the base layer 13 may selectively further comprise a second bending portion 134, the second bending portion 134 is adjacent to the central portion 132, and an interface between the second bending portion 134 and the central portion 132 is defined as a second bending line L2. The second bending portion 134 could have the same meaning of the first protrusion part 121 or the second protrusion part 131 in the previous paragraphs. The second bending line L2 could be an intersecting line between the base layer 13 and the first protrusion part 121 or the second protrusion part 131 in the previous paragraphs. When the base layer 13 simultaneously comprises the first bending portion 133 and the second bending portion 134, the extension directions of the first bending line L1 and the second bending line L2 can be identical or different. In the aspects shown in FIG. 4 to FIG. 6, the extension directions of the first bending line L1 and the second bending line L2 are different, so the first bending line L1 or an extension direction of the first bending line L1 crosses the second bending line L2 or an extension direction of the second bending line L2. In addition, the first bending portion 133 has a first side 1331, and the first side 1331 crosses the first bending line L1 or an extension direction of the first bending line L1. The second bending portion 134 has a second side 1341, and the second side 1341 crosses the second bending line L2 or an extension direction of the second bending line L2.

In FIG. 4, the first side 1331 and the second side 1341 are formed by a right angle formed through two cutting steps. In FIG. 5, the first side 1331 and the second side 1341 are formed by a chamfer formed through one cutting step. In FIG. 4 and FIG. 5, in either the right angle formed through two cutting steps or the chamfer formed through one cutting step, the angle θ3 included between the first side 1331 and the second side 1341 can be ranged from 70 degrees to 250 degrees (for example, from 90 degrees to 180 degrees) before bending first bending portion 133 and the second bending portion 134. The angle θ4 included between the first side 1331 and the first bending line L1 and the angle θ5 included between the second side 1341 and the second bending line L2 may be respectively ranged from 10 degrees to 100 degrees (for example, from 45 degrees to 90 degrees), and the sum of the angle θ3, the angle θ4 and the angle θ5 are not more than 270 degrees. In FIG. 4, the angle θ3 is 90 degrees, and the angle θ4 and the angle θ5 are also 90 degrees. In FIG. 5, the angle θ3 is 180 degrees, and the angle θ4 and the angle θ5 are 45 degrees. However, the present disclosure is not limited thereto.

In FIG. 4 and FIG. 5, both the first side 1331 and the second side 1341 are linear sides. However, the first side 1331 and the second side 1341 are not limited to be linear sides, and can be curved sides. As shown in FIG. 6, the first side 1331 and the second side 1341 are formed by an arc cutting angle formed through one cutting step. Thus, as shown in FIG. 6, the first side 1331 and the second side 1341 are curved sides. In the aspect that the cutting angle is an arc cutting angle shown in FIG. 6, a tangent line at the point that the first side 1331 and the first bending line L1 or the extension direction of the first bending line L1 cross can be obtained, and the angle θ4 included between the first side 1331 and the first bending line L1 can be defined as the angle included between the aforesaid tangent line and the first bending line L1 or the extension direction of the first bending line L1. Similarly, another tangent line at the point that the second side 1341 and the second bending line L2 or the extension direction of the second bending line L2 cross can be obtained, and the angle θ5 included between the second side 1341 and the second bending line L2 can be defined as the angle included between the aforesaid another tangent line and the second bending line L2 or the extension direction of the second bending line L2.

In FIG. 4 to FIG. 6, after the cutting process, the first bending portion 133 and the second bending portion 134 can be respectively bended toward the support layer 11 along the first bending line L1 and the second bending line L2, as shown in FIG. 3B, wherein the second protrusion part 131 shown in FIG. 3B can be considered as the first bending portion 133 and the second bending portion 134 shown in FIG. 4 to FIG. 6. During the cutting process, the first bending portion 133 and the second bending portion 134 can be formed by the right angle shown in FIG. 4, the chamfer shown in FIG. 5 or the arc cutting angle shown in FIG. 6. Thus, both the first bending portion 133 and the second bending portion 134 can be bended along the first bending line L1 and the second bending line L2 at the same time, in which the first bending line L1 and the second bending line L2 are different and cross. Thus, the problem that the first bending portion 133 and the second bending portion 134 cannot be simultaneously bended can be solved.

Figure 7A:
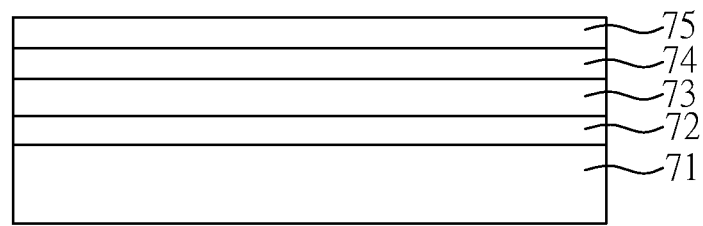
FIG. 7A is a cross sectional view of a display device according to one embodiment of the present disclosure.

In the present disclosure, the display device obtained by the aforesaid embodiments can be co-used with a touch panel, to obtain a touch display device. For example, FIG. 7A is a cross sectional view of a touch display device according to one embodiment of the present disclosure, which comprises: a backlight module 71, a transistor substrate 72 disposed on the backlight module 71 and having a structure shown in any one of FIG. 1 to FIG. 6; a display layer 73 disposed on the transistor substrate 72; a counter substrate 74 disposed on the display layer 73; and a protection substrate 75 disposed on the counter substrate 74. Herein, touch unis (not shown in the figure) may be disposed on the transistor substrate 72 to obtain an in-cell touch display device; the touch unis (not shown in the figure) may be disposed between the counter substrate 74 and the protection substrate 75 to obtain an on-cell touch display device; or the touch unis (not shown in the figure) may be disposed can be disposed outside the protection substrate 75 to obtain an out-cell touch display device. In addition, the protection substrate 75 can be a protection glass substrate or a polarizer. Furthermore, in the aspect shown in FIG. 7A, the display layer 73 can be a liquid crystal layer, an organic light emitting diode layer or an inorganic light emitting diode layer.

Figure 7B:
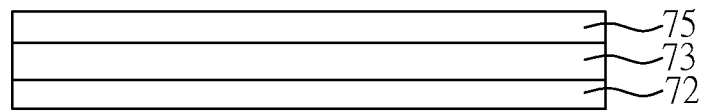
FIG. 7B is a cross sectional view of a display device according to another embodiment of the present disclosure.

FIG. 7B is a cross sectional view of a touch display device according to another embodiment of the present disclosure, which comprises: a transistor substrate 72 having a structure shown in any one of FIG. 1 to FIG. 6; a display layer 73 disposed on the transistor substrate 72; and a protection layer 75 disposed on the display layer 73. Herein, touch unis (not shown in the figure) may be disposed on the transistor substrate 72 to obtain an in-cell touch display device; the touch unis (not shown in the figure) may be disposed between the display layer 73 and the protection substrate 75 to obtain an on-cell touch display device; or the touch unis (not shown in the figure) may be disposed can be disposed outside the protection substrate 75 to obtain an out-cell touch display device. In addition, the protection substrate 75 can be a protection glass substrate or a polarizer. Furthermore, in the aspect shown in FIG. 7A, the display layer 73 can be an organic light emitting diode layer or an inorganic light emitting diode layer.

Figure 8A:
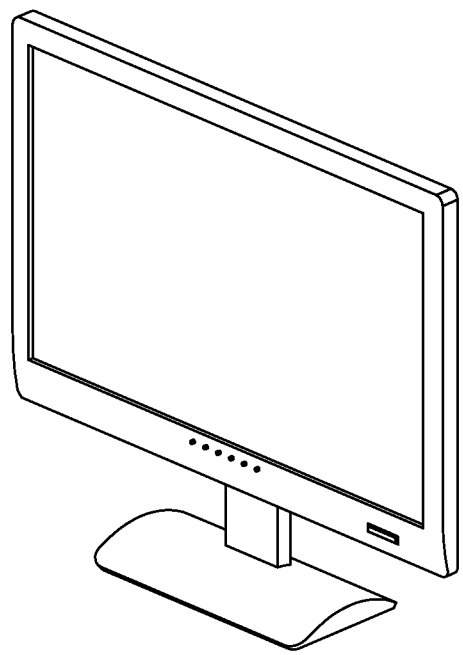
FIG. 8A and FIG. 8B are perspective views showing electronic devices capable of applying to the present disclosure.
Figure 8B:
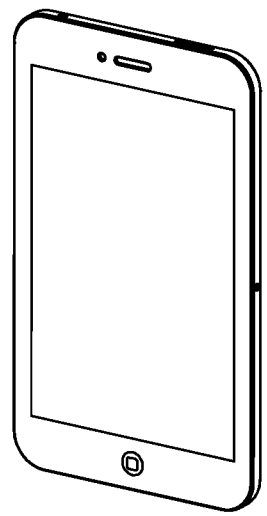

Meanwhile, a display device or touch display device made as described in any of the embodiments of the present disclosure as described previously may be applied to any electronic devices known in the art that need a display screen, such as displays shown in FIG. 8A, mobile phones shown in FIG. 8B, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
    a support layer comprising a first surface, a second surface and a first side wall, wherein the first surface and the second surface locate at two opposite sides of the support layer, the first side wall connects the first surface and the second surface, wherein the first side wall comprises a side surface connecting to the second surface, a first angle is included between the first surface and the first side wall, and a second angle is included between the second surface and the side surface;
    an adhesion layer disposed on the second surface of the support layer;
    a base layer disposed on the adhesion layer; and
    at least one transistor disposed on the base layer,
    wherein the first angle and the second angle are greater than 0 degree and less than 180 degrees, and the first angle and the second angle are different,
    wherein the adhesion layer has a first protrusion part, and the first protrusion part adheres to the side surface of the support layer.

2. The display device of claim 1, wherein the support layer has a first thickness, the adhesion layer has a second thickness, the base layer has a third thickness, the second thickness is less than the first thickness, and the third thickness is less than the first thickness.

3. The display device of claim 1, wherein the base layer comprises a central portion and a first bending portion, the first bending portion is adjacent to the central portion, and the first bending portion is bended toward the support layer.

4. The display device of claim 3, wherein the base layer further comprises a second bending portion, the second bending portion is adjacent to the central portion, and the second bending portion is bended toward the support layer.

5. The display device of claim 3, wherein the first bending portion has a first side, and the first side is linear or curved.

6. The display device of claim 1, wherein the first protrusion part is protruded outside the second surface of the support layer.

7. The display device of claim 1, wherein at least a portion of the first protrusion part is not in contact with the support layer.

8. The display device of claim 1, wherein the base layer has a second protrusion part, and the second protrusion part is protruded outside the second surface of the support layer, wherein the second protrusion part overlaps at least portion of the side wall of the support layer along a direction perpendicular to a thickness direction of the support layer.

9. The display device of claim 8, wherein at least a portion of the second protrusion part is not in contact with the support layer.

10. The display device of claim 1, wherein the base layer is flexible.

11. An electrical device, comprising:
    a display device, comprising:
    a support layer comprising a first surface, a second surface and a first side wall, wherein the first surface and the second surface locate at two opposite sides of the support layer, the first side wall connects the first surface and the second surface, wherein the first side wall comprises a side surface connecting to the second surface, a first angle is included between the first surface and the first side wall, and a second angle is included between the second surface and the side surface;
    an adhesion layer disposed on the second surface of the support layer;
    a base layer disposed on the adhesion layer, wherein the base layer comprises a central portion and a first bending portion, the first bending portion is adjacent to the central portion, and the first bending portion is bended toward the support layer; and
    at least one transistor disposed on the base layer,
    wherein the first angle and the second angle are greater than 0 degree and less than 180 degrees, and the first angle and the second angle are different,
    wherein the adhesion layer has a first protrusion part, and the first protrusion part adheres to the side surface of the support layer.

12. The electrical device of claim 11, wherein the base layer further comprises a second bending portion, the second bending portion is adjacent to the central portion, and the second bending portion is bended toward the support layer.

13. The electrical device of claim 11, wherein the support layer has a first thickness, the adhesion layer has a second thickness, the base layer has a third thickness, the second thickness is less than the first thickness, and the third thickness is less than the first thickness.

14. The electrical device of claim 11, wherein the first bending portion has a first side, and the first side is linear or curved.

15. The electrical device of claim 11, wherein the first protrusion part is protruded outside the second surface of the support layer.

16. The electrical device of claim 11, wherein at least a portion of the first protrusion part is not in contact with the support layer.

17. The electrical device of claim 11, wherein the base layer has a second protrusion part, and the second protrusion part is protruded outside the second surface of the support layer, wherein the second protrusion part overlaps at least portion of the side wall of the support layer along a direction perpendicular to a thickness direction of the support layer.

18. The electrical device of claim 17, wherein at least a portion of the second protrusion part is not in contact with the support layer.

19. The electrical device of claim 11, wherein the base layer is flexible.

* * * * *